United States Patent [19]
Hartman et al.

[11] Patent Number: 4,504,952
[45] Date of Patent: Mar. 12, 1985

[54] STRIPE-GUIDE TJS LASER

[75] Inventors: Robert L. Hartman, Warren; Louis A. Koszi, Scotch Plains; Bertram Schwartz, Westfield, all of N.J.

[73] Assignee: AT&T Bell Laboratories, Murray Hill, N.J.

[21] Appl. No.: 383,778

[22] Filed: Jun. 1, 1982

[51] Int. Cl.³ .......................... H01S 3/19; H01S 3/18
[52] U.S. Cl. .................................. 372/45; 357/17; 372/46; 372/47; 372/48
[58] Field of Search ................. 372/47, 48, 45, 46; 357/17

[56] References Cited
U.S. PATENT DOCUMENTS 3,758,875  9/1973  Hayashi .......................... 331/94.5
4,183,038  1/1980  Namizaki et al. .................. 357/17
4,326,176  4/1982  Aiki et al. ........................ 372/45

OTHER PUBLICATIONS

Mori et al., "V–DH Laser: A Laser with a V-Shaped Active Region Grown by Metalorganic C.V.D", Electronics Letters, vol. 16, No. 20, Sep. 25, 1980, pp. 785–787.

Primary Examiner—James W. Davie
Attorney, Agent, or Firm—Michael J. Urbano

[57] ABSTRACT

A TJS light emitting diode (laser or LED) comprises an isotype double heterostructure (DH) and a V-groove which penetrates the intermediate layer of the DH. The groove is filled with a region of semiconductor material which enables carrier injection to occur from the region into the intermediate layer, or conversely, depending on the relative bandgaps of the layer and region. Real-refractive index guiding by the groove is described.

10 Claims, 2 Drawing Figures

STRIPE-GUIDE TJS LASER

BACKGROUND OF THE INVENTION

This invention relates to semiconductor lasers.

A conventional double heterostructure (DH) semiconductor laser typically includes a narrow bandgap active layer bounded by a pair of opposite-conductivity-type, wide bandgap, cladding layers. Thus, the interfaces between the active and cladding layers constitute a p-n heterojunction and a p-p or n-n (isotype) heterojunction. When the p-n heterojunction is forward biased, minority carriers are injected across it into the active layer. In the direction transverse to the layers, these carriers are confined to the active layer by the heterjunctions. The carriers undergo radiative recombination and generate stimulated emission in a direction parallel to the layers but perpendicular to a pair of mirrors, typically cleaved crystal facets. This type of laser is described by I. Hayashi in U.S. Pat. No. 3,758,875, assigned to the assignee hereof.

A somewhat more complex version of the semiconductor laser, known as the transverse junction stripe (TJS) laser, injects minority carriers across a p-n homojunction which is oriented transverse to the layers of an isotype DH configuration. As described in U.S. Pat. No. 4,183,038 granted to H. Namizaki et al, a TJS laser illustratively comprises an n-type isotype DH (i.e., an n-type or undoped active layer bounded by n-type cladding layers) and an elongated p-type zone which extends longitudinally along the resonator axis. This zone also extends transversely in one direction from the top surface toward the substrate, but transversely in the orthogonal direction only part way across the mirror faces. Typically, the p-type zone is formed by diffusing a p-type impurity (e.g., Zn) through a stripe mask on the top surface of the laser. Thus, the diffusion front defines a p-n homojunction which intersects the active layer at approximately a right angle and, when forward biased, injects minority carriers laterally from the p-type side of the active layer into the n-type side of the active layer.

This type of TJS laser suffers, however, from lack of good fabrication control because of the need to perform a relatively deep diffusion and from a lack of adequate waveguide control for the transverse position of the optical mode.

SUMMARY OF THE INVENTION

In accordance with one aspect of our invention, a semiconductor TJS light emitting diode (laser or LED) includes a semiconductor body having a first region of one conductivity type, an elongated groove which penetrates the first region, and a second region of material in the bottom of the groove of the opposite conductivity type, thus forming a p-n junction along the sides of the groove adjacent the first region. When the second region has a wider bandgap than the first region and the p-n junction is forward biased, minority carriers are injected from the second region into the first region, thereby causing the emission of spontaneous or stimulated radiation from the first region depending on whether the deivce is adapted for LED or laser operation, respectively. On the other hand, when the second region has a lower bandgap (and hence higher refractive index) than the first region, carriers are injected from the first region into the second region, thereby causing emission from the second region. When operated as a laser, the optical mode will be guided by the elongated groove which, in both embodiments, is made to extend along the resonator axis.

In an illustrative embodiment, the semiconductor body comprises an isotype DH and the groove comprises a V-groove etched through the top, wide bandgap, cladding layer into the underlying, narrower bandgap, intermediate layer which corresponds to the aforesaid first region. The bottom of the V-groove is filled with a second region of semiconductor material having a conductivity type opposite to that of the intermediate layer so that carrier injection occurs laterally between the second region and the intermediate layer. The radiative recombination region, in which the injected carriers recombine to produce radiation, depends primarily on the relative bandgaps of the second region and the intermediate layer.

Our TJS light emitting diodes, in particular the lasers, have potential for excellent electrooptical performance, low power density at the mirror facets, narrow beam divergence, and good control of growth and fabrication.

BRIEF DESCRIPTION OF THE DRAWING

Our invention, together with its various features and advantages, can be readily understood from the following, more detailed description taken in conjunction with the accompanying drawing, in which.

DETAILED DESCRIPTION

Figure 1:
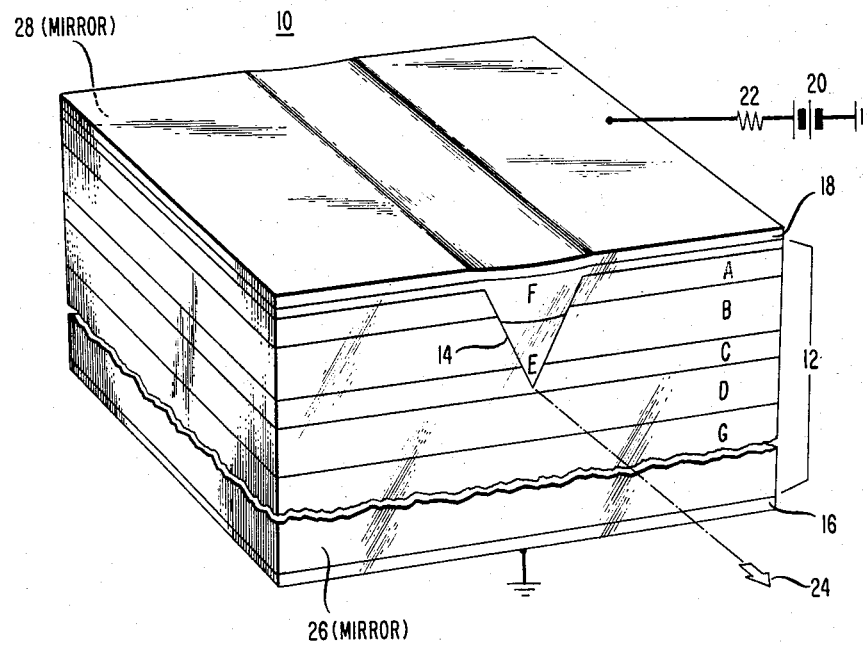
FIG. 1 schematically illustrates a TJS semiconductor laser in accordance with one embodiment of our invention in which the apex of the V-groove is located in the intermediate layer of a DH.

With reference now to FIG. 1, there is shown a TJS light emitting diode 10 comprising a semiconductor body 12 including a first region C and having a groove 14 which penetrates region C. The bottom of groove 14 is filled with a second region E of semiconductor material having in general a conductivity type opposite to that of the surrounding portions of body 12 and having in particular a conductivity type opposite to that of first region C. In order to render the structure essentially planar, the remaining portion of the groove 14, that is third zone F, is preferably filled with a semiconductor material having the same conductivity type as that of region E. Thus, a p-n junction is formed in general at the interface between the region E and zone F taken together, on the one hand, and the remainder of body 12, on the other hand. In particular, a p-n junction is formed where region E penetrates region C.

In order to forward bias the p-n junction, electrodes 16 and 18 are formed on body 12, with electrode 18 being in contact with zone F. Illustratively, a source 20 (e.g., a battery) provides forward bias voltage and pumping current through a current-limiting resistor 22 which is connected to electrode 18 when electrode 16 is grounded.

When region E has a wider bandgap than region C, minority carriers are injected laterally from region E into region C where they undergo radiative recombination and emit radiation in a direction shown by arrow 24; i.e., as an edge-emitting LED. However, when a cavity resonator is provided (e.g., by cleaved, parallel mirror facets 26–28, or by well-known distributed feedback means not shown) and pumping current is provided by source 20 in excess of the lasing threshold, the device operates as a laser. Significantly, region E functions as a real-refractive-index guide for the optical modes of the laser.

On the other hand, when region E has a narrower bandgap than region C, minority carriers are injected laterally from region C into region E where they undergo radiative recombination and again emit radiation in the direction of arrow 24. When incorporated with a resonator and operated as a laser (as above), the optical mode associated with the stimulated emission is again guided by the groove because region E, having a narrower bandgap, perforce has a higher refractive index than the surrounding portions of body 12.

In order to reduce lattice defects which tend to introduce nonradiative recombination centers, the body 12, region E and zone F are preferably made of essentially lattice-matched semiconductor materials, typically Group III-V compound such as GaAs-AlGaAs or InP-InGaAsP.

In an illustrative embodiment of our TJS laser shown in FIG. 1, the body 12 is an n-type, isotype DH which comprises an n-type, relatively narrow bandgap layer C (i.e., corresponding to first region C) bounded by n-type, wider bandgap cladding layers B and D. These layers are epitaxially grown on a monocrystalline substrate G by a suitable technique such as liquid phase epitaxy (LPE), molecular beam epitaxy, vapor phase epitaxy, or organo-metallic chemical vapor deposition. A current-restricting cap layer A may be grown on cladding layer B.

Then, standard photolithographic masking and known etching techniques are employed to form V-groove 14 which extends through layers A and B and penetrates layer C. In the GaAs-AlGaAs materials system, such V-grooves have been controllably formed in (100)-oriented layers by using bromine-methanol or $H_2SO_4:H_2O_2:H_2O$ solutions as an etchant. Etching stops on the {111}A planes which allows photolithographic procedures to define the dimensions of the V-groove. Similar results are obtainable in the InP-InGaAsP system using a bromine-methanol solution as an etchant to form V-grooves in (100)-oriented layers.

After the V-groove 14 is formed, semiconductor materials are regrown into the V-groove to form region E and zone F, preferably so that the bandgap of the latter is greater than that of the former so that minority carriers are confined to region E when carriers are injected therein from region C or so that carriers are not injected into zone F when injection is from region E into region C. In the GaAs-AlGaAs materials system, this structure has several advantages for LPE regrowth: (1) regrowth starts at the apex of the V-groove in layer C which, therefore, should have little (e.g., <10%) or no Al content; (2) the apex of the V-groove provides a reentrant angle to assist nucleation and growth, and (3) the sides of the V-groove are {111} surfaces upon which LPE AlGaAs can be successfully regrown notwithstanding that adjacent layers A and B contains significant amounts of Al.

In one embodiment, the compositions of the layers are adapted so that (1) the bandgaps satisfy $E_B \sim E_D \sim E_F > E_E > E_C$ (2) the conductivity type of region E and zone F is opposite to that of layers B, C and D. If, in addition, layer A is made to be highly resistive, then the operative p-n junction for minority carrier injection is along the {111} surfaces of V-groove 14. Under forward bias, minority carriers are injected transversely from region E into layer C where they undergo radiative recombination and emit radiation at a wavelength characteristic of the material of layer C.

Layer A can be made highly resistive in several ways known in the art: e.g., by making layer A a composite of two layers which form a reverse-biased p-n junction; by heavily compensating layer A with suitable impurities; by making layer A of $Al_xGa_{1-x}As$ with a high ($x \geq 0.6$)Al content; or by bombarding layer A with protons or deuterons before the V-groove is formed.

Illustratively, layer A comprises n-$Al_xGa_{1-x}As(x \geq 0.6)$, layer B comprises n-$Al_yGa_{1-y}As$, layer C comprises n-GaAs, layer D comprises $Al_zGa_{1-z}As$, zone F comprises $Al_pGa_{1-p}As(p \sim y \sim z)$, and region E comprises $Al_qGa_{1-q}As(q < p)$.

Alternatively, the composition of the layers can be adapted so that the bandgaps and conductivity types satisfy the specifications above except that $E_E < E_C$ in which case, under forward bias, minority carriers are injected transversely from layer C into region E where they undergo radiative recombination and emit radiation at a wavelength characteristic of the material of region E.

These stripe-guide TJS lasers have the advantage that the emitted optical beam should be less divergent than in prior art TJS lasers because the optical mode is guided as described above. For the same reason, the beam should be more easily coupled into an optical fiber. Moreover, the optical power density at the mirror facets should also be lower because the surface area of the mirrors (26, 28) through which the optical mode is emitted can be designed to be large by adjusting the parameters of zone E, a feature which has positive implications for improved reliability.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

Figure 2:
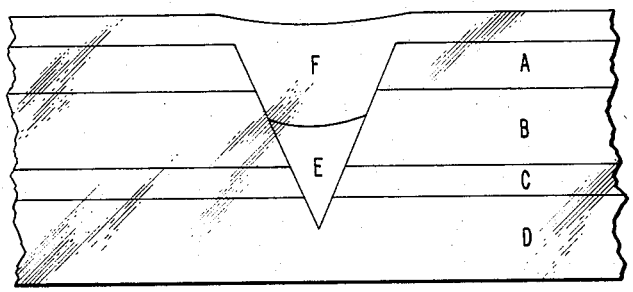
FIG. 2 similarly illustrates a TJS laser in accordance with another embodiment of our invention in which the apex of the V-groove is located in the bottom cladding layer of a DH.

In particular, the V-groove may be photolithographically defined so that it does not extend to the mirror facets, thereby containing the p-n junction within the bulk of the laser chip and allowing "passive" mirrors to be formed by cleaving or etching. In addition, whereas the foregoing embodiments depict the V-groove as penetrating layer C so that the apex is within layer C, it is also contemplated that the V-groove can penetrate layer C with the apex being in layer D as shown in FIG. 2. The operative p-n junction would still be between region E and layer C. Finally, standard proton bombardment damage or the equivalent can be introduced on both sides of the V-groove to reduce the relatively small leakage currents which might flow across the high bandgap p-n junction between layer B, and region E and zone F.

What is claimed is:
1. In a light emitting device, a body comprising
   a first semiconductor region of one conductivity type,
   a relatively narrow bandgap layer constituting said first region and a pair of wider bandbap cladding layers bounding said narrow bandgap layer, said layers all being of said one conductivity type, a groove which penetrates said first region, a second semiconductor region at the bottom of said groove, said second region having a second conductivity type and a bandgap different from that of said first region, thereby forming a p-n junction along the edges of said groove effective to inject carriers from one of said regions into the other when said junction is forward biased, radiative recombination of said carriers occurring in said other region, and electrode means for forward biasing said p-n junction.

2. The body of claim 1 wherein said first region has a bandgap larger than said second region.

3. The body of claim 1 wherein said first region has a bandgap smaller than said second region.

4. The body of claim 1 wherein said groove penetrates through one of said cladding layers into said narrow bandgap layer.

5. The body of claim 1 wherein said groove penetrates through one of said cladding layers and said narrow bandgap layer into the other of said cladding layers.

6. The body of claim 1 further including a semiconductor zone located in said groove and on said second region, said zone having said second conductivity type and bandgap larger than that of said second region.

7. The body of claim 1 wherein said layers comprise (001)-oriented Group III–V compound semiconductor epitaxial crystals, and said groove is a V-groove the sidewalls of which constitute {111}A crystallographic planes.

8. The body of claim 7 for use as a laser and further including resonator means for generating stimulated emission of said radiative recombination.

9. The body of claim 1 further including a highly resistive layer formed on one of said cladding layers.

10. A semiconductor laser comprising a double heterostructure including a first semiconductor region having a relatively narrow bandgap first semiconductor layer, and a pair of wider bandgap semiconductor cladding layers which bound said first layer, a highly resistive semiconductor layer located on one of said cladding layers, said first layer and said cladding layers all having one conductivity tape, an elongated V-groove which extends through said resistive layer and said one cladding layer and penetrates said first layer, a second semiconductor region located at the bottom of said groove, said second region having a second conductivity type and a bandgap different from said first layer, a semiconductor zone located on said second region, said zone having said second conductivity type and a bandgap larger than said second region, thereby forming a p-n junction along the edges of said groove effective to inject carriers from one of said regions into the other, radiative recombination of said carriers occurring in said other region, electrode means for forward biasing said p-n junction and for applying pumping current in excess of the lasing threshold, and resonator means for generating stimulated emission of said radiative recombination, the axis of said resonator being parallel to said groove and the optical modes of said emission being guided along said groove.

* * * * *